(12) United States Patent
Tanaka et al.

(10) Patent No.: US 9,270,193 B2
(45) Date of Patent: Feb. 23, 2016

(54) POWER SEMICONDUCTOR MODULE, POWER CONVERTING APPARATUS, AND RAILWAY CAR

(75) Inventors: Takeshi Tanaka, Tokyo (JP); Shinichi Kinouchi, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 537 days.

(21) Appl. No.: 13/582,834

(22) PCT Filed: Oct. 29, 2010

(86) PCT No.: PCT/JP2010/069383
§ 371 (c)(1),
(2), (4) Date: Sep. 5, 2012

(87) PCT Pub. No.: WO2011/111262
PCT Pub. Date: Sep. 15, 2011

(65) Prior Publication Data
US 2012/0326646 A1 Dec. 27, 2012

(30) Foreign Application Priority Data

Mar. 9, 2010 (WO) .................. PCT/JP2010/053906

(51) Int. Cl.
*H02P 6/14* (2006.01)
*H01L 29/267* (2006.01)
(Continued)

(52) U.S. Cl.
CPC ............... *H02M 5/4585* (2013.01); *B60L 9/22* (2013.01); *H03K 17/127* (2013.01); *B60L 2200/26* (2013.01)

(58) Field of Classification Search
None
See application file for complete search history.

(56) References Cited

U.S. PATENT DOCUMENTS 4,398,142 A 8/1983 Beasom
6,654,260 B2 * 11/2003 Okayama et al. ............... 363/37
(Continued)

FOREIGN PATENT DOCUMENTS

JP 62-202548 A 9/1987
JP 2001-245479 A 9/2001
(Continued)

OTHER PUBLICATIONS

International Search Report (PCT/ISA/210) issued on Feb. 1, 2011, by the Japanese Patent Office as the International Searching Authority for International Application No. PCT/JP2010/069383.
(Continued)

*Primary Examiner* — Robert Carpenter
(74) *Attorney, Agent, or Firm* — Buchanan Ingersoll & Rooney PC

(57) ABSTRACT

A power semiconductor module includes an element pair formed by connecting, in anti-parallel to each other, an IGBT and an FWD group in which an FWD, a voltage drop characteristic of which during conduction has a negative temperature coefficient, and an FED, a voltage drop characteristic of which during conduction has a positive temperature coefficient, are connected in series and an element pair formed by connecting, in anti-parallel to each other, an IGBT and an FWD group in which a FWD, a voltage drop characteristic of which during conduction has a negative temperature coefficient, and an FWD, a voltage drop characteristic of which during conduction has a positive temperature coefficient, are connected in series. The element pairs are connected in parallel.

5 Claims, 5 Drawing Sheets

(51) Int. Cl.
  *H02M 5/45* (2006.01)
  *H02M 5/458* (2006.01)
  *B60L 9/22* (2006.01)
  *H03K 17/12* (2006.01)

(56) References Cited

U.S. PATENT DOCUMENTS

| | | | |
|---|---|---|---|
| 8,643,345 B2* | 2/2014 | Morimoto | 323/207 |
| 2008/0191216 A1 | 8/2008 | Machida et al. | |
| 2009/0168471 A1 | 7/2009 | Tsugawa et al. | |
| 2010/0277871 A1* | 11/2010 | Kitanaka et al. | 361/710 |

FOREIGN PATENT DOCUMENTS

| | | | |
|---|---|---|---|
| JP | 2002-369498 A | | 12/2002 |
| JP | 2003-199354 A | | 7/2003 |
| JP | 2003-284318 A | | 10/2003 |
| JP | 2008-072863 A | | 3/2008 |
| WO | WO 2008152686 A1 | * | 12/2008 |

OTHER PUBLICATIONS

Written Opinion (PCT/ISA/237) issued on Feb. 1, 2011, by the Japanese Patent Office as the International Searching Authority for International Application No. PCT/JP2010/069383.

Richmond et al., "Roadmap for Megawatt Class Power Switch Modules Utilizing Large Area Silicon Carbide MOSFETs and JBS Diodes" Energy Conversion Congress and Exposition, 2009. ECCE. IEEE, IEEE, Piscataway, NJ, USA, (Sep. 20, 2009), pp. 106-111, XP031887523.

Extended European Search Report issued on Sep. 3, 2013, by the European Patent Office in corresponding European Patent Application No. 10847489.1-1809 (9 pages).

European Office Action dated Dec. 1, 2014 issued in corresponding European Patent Appln. No. 10847489.1 (6 pages).

Communication pursuant to Article 94(3) EPC issued on Jul. 3, 2015, by the European Patent Office in corresponding European Patent Application No. 10 847 489.1-1809. (7 pages).

* cited by examiner

POWER SEMICONDUCTOR MODULE, POWER CONVERTING APPARATUS, AND RAILWAY CAR

FIELD

The present invention relates to a power converting apparatus applicable to a railway car and, more specifically, to a power semiconductor module mountable on the power converting apparatus of this type.

BACKGROUND

Although not limited to the use in the railway car, for example, Patent Literature 1 described below discloses a power semiconductor module including two element pairs formed by connecting transistor chips and fly wheel diode (FWD) chips in anti-parallel to each other (see FIGS. 1 and 6 of the literature).

In the power semiconductor module of this type, if collector terminals, emitter terminals, and base terminals in the respective element pairs are electrically connected to one another, the element pairs are connected in parallel. The power semiconductor module can be used as a power semiconductor module having an increased current capacity (sometimes referred to as "parallel application").

CITATION LIST

Patent Literature

Patent Literature 1: Japanese Patent Application Laid-open No. 62-202548

SUMMARY

Technical Problem

However, in the power semiconductor module in the past in the parallel application, there is a problem in that, when a difference equal to or larger than a fixed value occurs between a forward saturation voltage of one FWD and a forward saturation voltage of the other FWD because of fluctuation in manufacturing or the like, the power semiconductor module shows a certain kind of a thermal runaway state in which the temperature of one FWD rises to be higher than the temperature of the other FWD and a temperature difference between the FWDs expands according to the use of the FWDs. Therefore, in the parallel application in the past, the FWDs connected in parallel have to be selected such that a difference between the forward saturation voltages of the FWDs is equal to or smaller than the fixed value.

In the power semiconductor module, switching elements (e.g., IGBTs) connected in anti-parallel to the FWDs are present. Concerning the switching elements, as in the FWDs, it is necessary to suppress fluctuation in forward voltage characteristics to be equal to or smaller than the fixed value. Therefore, in the power semiconductor module in the parallel application in the past, there is a difficulty in that both of the switching elements and the FWDs have to be concurrently selected. There is a problem in that yield for parallel operation is extremely large and manufacturing costs increase.

The present invention has been devised in view of the above and it is an object of the present invention to provide a power semiconductor module that can improve the yield of the power semiconductor module in the parallel application and suppress the increase in the manufacturing costs.

It is also an object of the present invention to provide a power converting apparatus including the power semiconductor module and a railway car including the power converting apparatus.

Solution to Problem

A power semiconductor module according to an aspect of the present invention includes: a first element pair formed by connecting, in anti-parallel to each other, a first switching element and a first element group in which a first unidirectional conductive element of a Schottky barrier type formed of a wideband gap semiconductor and a first conductive element formed of a narrowband gap semiconductor, a voltage drop characteristic of which during conduction has a negative temperature coefficient, are connected in series; and a second element pair formed by connecting, in anti-parallel to each other, a second switching element and a second element group in which a second unidirectional conductive element of the Schottky type formed of the wideband gap semiconductor and a second conductive element formed of the narrowband gap semiconductor, a voltage drop characteristic of which during conduction has a negative temperature coefficient, are connected in series, wherein the first and second element pairs are connected in parallel.

Advantageous Effects of Invention

According to the present invention, there is an effect that it is possible to provide a power semiconductor module that can improve the yield of the power semiconductor module in the parallel application and suppress the increase in the manufacturing costs.

DESCRIPTION OF EMBODIMENTS

A power semiconductor module and a power converting apparatus according to an embodiment of the present invention are explained below with reference to the accompanying drawings. The present invention is not limited by the embodiment explained below.

First Embodiment

Figure 1:
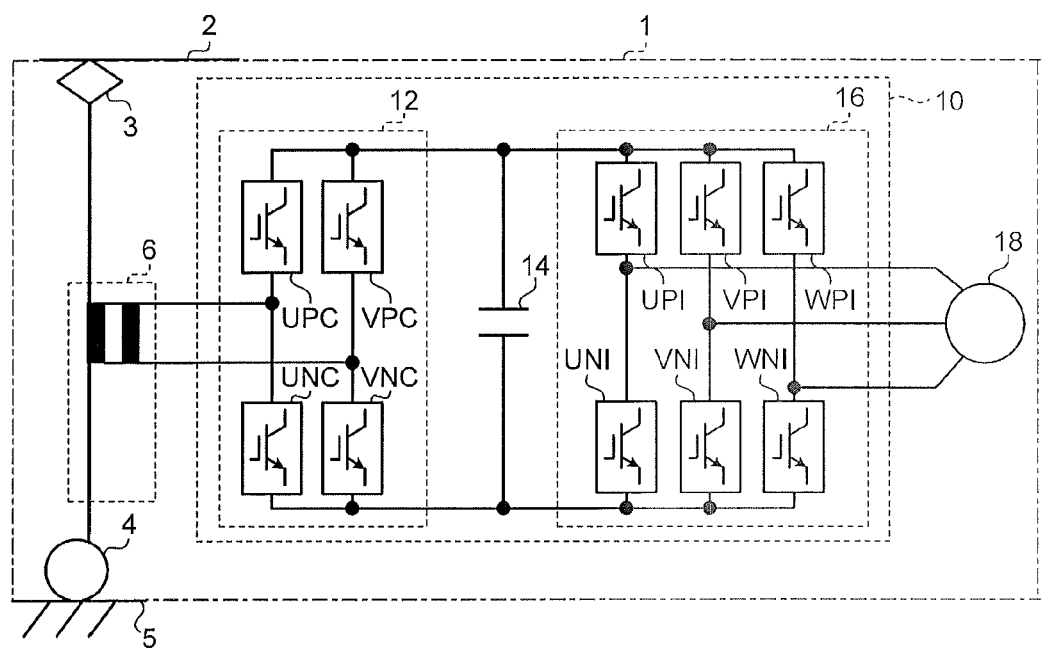
FIG. 1 is a diagram of a schematic functional configuration of a power converting apparatus according to an embodiment of the present invention.

First, the power converting apparatus according to a first embodiment of the present invention is explained. FIG. 1 is a diagram of a schematic functional configuration of the power converting apparatus according to this embodiment. A configuration example of a power converting apparatus 10 mounted on a railway car 1 is shown in FIG. 1. As shown in FIG. 1, the power converting apparatus 10 includes a converter 12, a capacitor 14, and an inverter 16. The railway car 1 is mounted with a transformer 6 arranged on an input end side of the power converting apparatus 10 and connected to the converter 12 and a motor 18 arranged on an output end side of the power converting apparatus 10, connected to the inverter 16, and supplied with electric power from the power converting apparatus 10 to drive the car. As the motor 18, an induction motor or a synchronous motor is suitable.

One end of primary winding of the transformer 6 is connected to an overhead line 2 via a current collector 3. The other end of the primary winding is connected to a rail 5, which is ground potential, via a wheel 4. Electric power supplied from the overhead line 2 is input to the primary winding of the transformer 6 via the current collector 3. Electric power generated in secondary winding of the transformer 6 is input to the converter 12.

The converter 12 includes circuit sections (hereinafter referred to as "legs") in which a positive side arm (e.g., in a U phase, UPC) including switching elements UPC and VPC and a negative side arm (e.g., in the U phase, UNC) including switching elements UNC and VNC are respectively connected in series. In other words, in the converter 12, a single-phase bridge circuit including two sets (for the U phase and a V phase) of legs is configured.

The converter 12 subjects the switching elements UPC, VPC, UNC, and VNC to PWM control to convert an input alternating-current voltage into a desired direct-current voltage and outputs the direct-current voltage.

The capacitor 14 functioning as a direct-current power supply is connected in parallel to an output end of the converter 12. The inverter 16 that receives a direct-current voltage of the capacitor 14 as an input, converts the direct-current voltage into an alternating-current voltage having an arbitrary voltage and an arbitrary frequency, and outputs the alternating-current voltage is connected to the output end.

The inverter 16 includes legs in which a positive side arm (e.g., in the U phase, UPI) including switching elements UPI, VPI, and WPI and a negative side arm (e.g., in the U phase, UNI) including switching elements UNI, VNI, and WNI are respectively connected in series. In other words, in the inverter 16, a three-phase bridge circuit including three sets (for the U phase, the V phase, and a W phase) of legs is configured.

The inverter 16 subjects the switching elements UPI, VPI, WPI, UNI, VNI, and WNI to PWM control to convert an input direct-current voltage into a desired alternating-current voltage and outputs the alternating-current voltage.

In FIG. 1, as a preferred example of the power converting apparatus according to this embodiment, the power converting apparatus is applied to an alternating-current input electric railcar. However, the power converting apparatus can also be applied to a direct-current input electric railcar frequently used in subways, suburban electric railcars, and the like. When the power converting apparatus is applied to the direct-current input electric railcar, a configuration equivalent to the configuration shown in FIG. 1 can be adopted except that the configuration of the transformer 6 and the converter 12 is unnecessary. It is naturally possible to apply the contents according to this embodiment to the direct-current input electric railcar.

Figure 2:
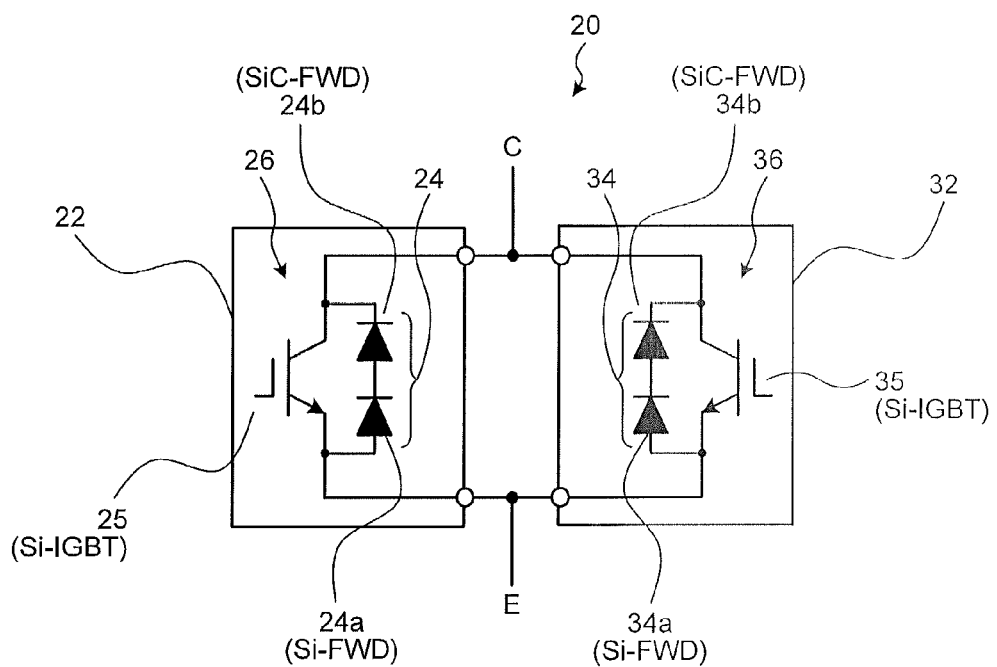
FIG. 2 is a schematic diagram of a circuit configuration of a power semiconductor module according to the embodiment.

A power semiconductor module applicable to the power converting apparatus according to this embodiment is explained. FIG. 2 is a schematic diagram of a circuit configuration of the power semiconductor module according to this embodiment. A power semiconductor module 20 according to this embodiment includes, as shown in FIG. 2, a first power module 22 and a second power module 32. The first and second power modules 22 and 32 are connected in parallel.

In the power converting apparatus shown in FIG. 1, for example, the power semiconductor module 20 can be applied to the switching elements UPC, VPC, UNC, and VNC included in the converter 12 or can be applied to the switching elements UPI, VPI, WPI, UNI, VNI, and WNI included in the inverter 16.

Referring back to FIG. 2, the first power module 22 includes an FWD group 24 in which a Si-FWD (FWD 24a) based on, for example, silicon (Si) and a SiC-FWD (FWD 24b) based on, for example, silicon carbide (SiC) are connected in series. The FWD group 24 connected in series and a Si-IGBT (IGBT 25) based on silicon are connected in anti-parallel to each other to configure an element pair 26. The configuration of the second power module 32 is the same. The second power module 32 includes an FWD group 34 in which a Si-FWD (FWD 34a) and a SiC-FWD (FWD 34b) are connected in series. The FWD group 34 connected in series and a Si-IGBT (IGBT 35) are connected in anti-parallel to each other to configure an element pair 36.

Terminals drawn out from respective one ends (respective collector ends of the Si-IGBTs) of the element pairs 26 and 36 are connected to each other to form a collector electrode C. Terminals drawn out from respective other ends (respective emitter ends of the Si-IGBTs) of the element pairs 26 and 36 are connected to each other to form an emitter electrode E.

In FIG. 2, the configuration is shown in which the power modules, in each of which one element pair formed by connecting the switching element and the FWD group in anti-parallel to each other is housed in one module (so-called "1-in-1" configuration), are connected in parallel. However, a configuration in which one set of element pairs connected in parallel to each other are housed in one module (so-called "2-in-1" configuration) can also be adopted.

Figure 3:
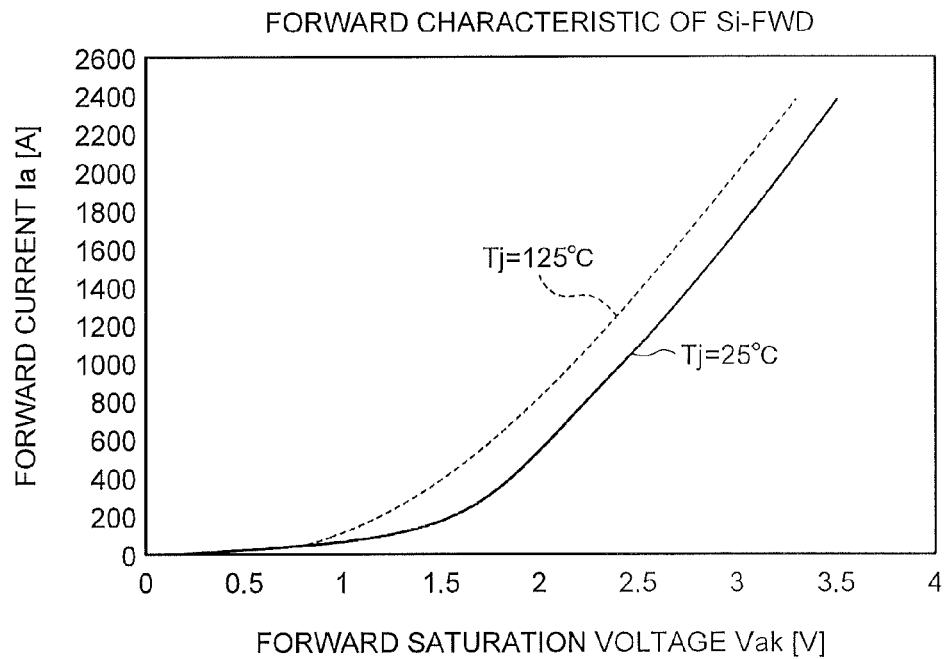
FIG. 3 is a graph for explaining a forward voltage characteristic of a Si diode.
Figure 4:
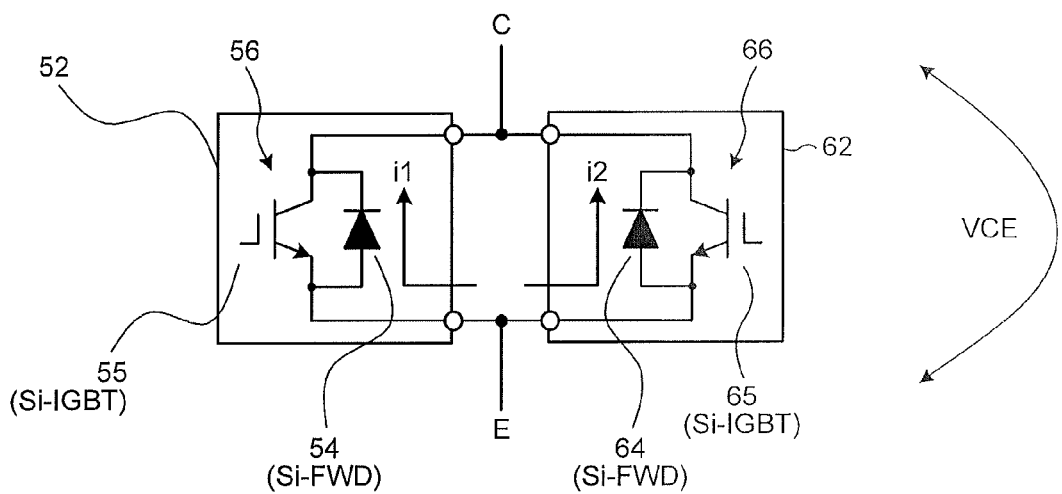
FIG. 4 is a schematic diagram of a circuit configuration of a power semiconductor module according to a related art shown as a comparative example.

The thermal runaway phenomenon in the parallel application referred to in the section of the background is explained with reference to FIGS. 3 and 4. FIG. 3 is a graph for explaining a forward voltage characteristic of a Si diode. In FIG. 3, junction temperature (Tj) of a PN junction section in the Si diode is set as a parameter and a change in a forward current (so-called "ON current") with respect to a forward saturation voltage (so-called "ON voltage") is shown. FIG. 4 is a schematic diagram of a circuit configuration of a power semiconductor module according to a related art shown as a comparative example.

First, as shown in FIG. 3, temperature dependency of the forward saturation voltage in the Si diode has a characteristic that the forward saturation voltage is smaller as the junction temperature is higher if a forward current value is the same. In other words, the Si diode is an element, a voltage drop characteristic of which during conduction has a negative temperature coefficient.

For example, when a forward saturation voltage of a Si-FWD (FWD 54) on an element pair 56 side is lower than a forward saturation voltage of a Si-FWD (FWD 64) on an element pair 66 side because of, for example, fluctuation in manufacturing, an electric current i1 flowing to the FWD 54 is larger than an electric current i2 flowing to the FWD 64.

At this point, because a power semiconductor module 52 and a power semiconductor module 62 are connected in parallel to each other, voltages (potential differences) VCE between collector terminals and emitter terminals of respective Si-IGBTs 55 and 65 are equal. Therefore, a loss VCE×i1 of the FWD 54 is larger than a loss VCE×i2 of the FWD 64. A heat value of the FWD 54 is larger than a heat value of the FWD 64. As a result, the temperature of the FWD 54 is higher than the temperature of the FWD 64. A temperature difference between the FWDs increases. Then, the forward saturation voltage of the FWD 54 drops to be further lower than the forward saturation voltage of the FWD 64. The electric current flowing to the FWD 54 further increases and the temperature difference between the FWDs further increases.

When there is a difference between the forward saturation voltage of one FWD included in the power semiconductor module and the forward saturation voltage of the other FWD in this way, a thermal runaway state occurs in which temperature rise, forward voltage drop, current increase, temperature rise, forward voltage drop, and current increase are repeated. In reality, the temperature rise of the FWDs is suppressed by a heat radiation phenomenon through a cooler. Therefore, if the fluctuation in manufacturing related to the forward saturation voltages is reduced to be equal to or smaller than a predetermined value (e.g., 0.2 volt), the thermal runaway state explained above can be suppressed. In any case, in the case of the power semiconductor module of the parallel application, the FWDs connected in parallel have to be selected such that a difference between the forward saturation voltages of the FWDs is equal to or smaller than the fixed value.

Figure 5:
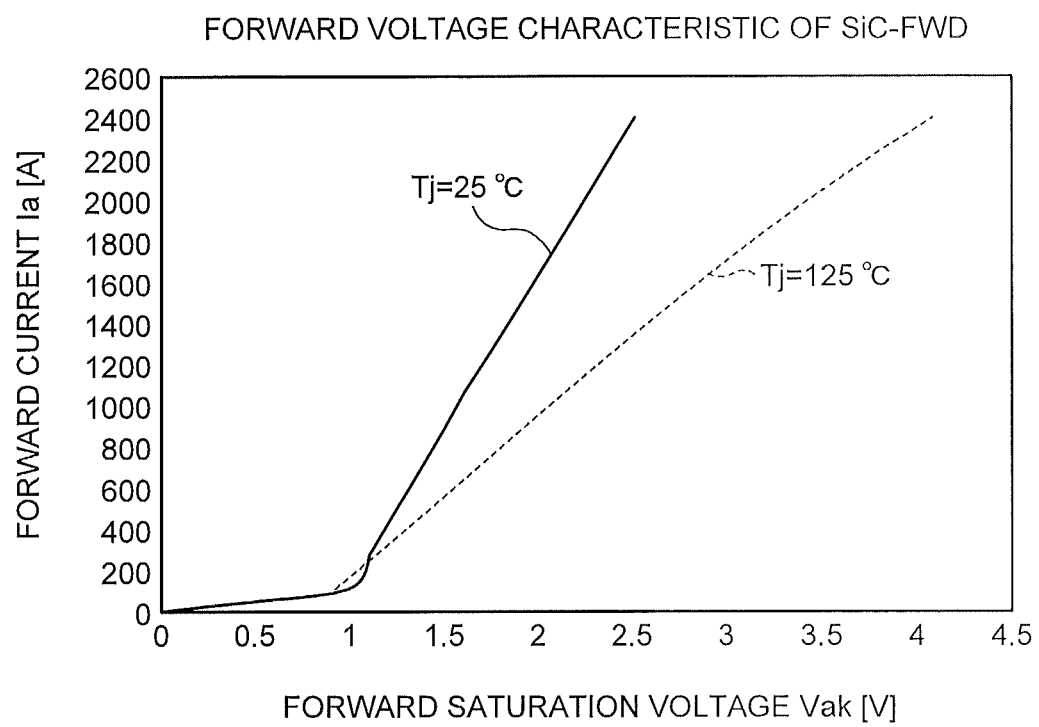
FIG. 5 is a graph for explaining a forward voltage characteristic of a SiC diode.

On the other hand, FIG. 5 is a graph for explaining a forward voltage characteristic of a SiC diode. In the graph shown in FIG. 5, junction temperature (Tj) is set as a parameter and a change in a forward current (an ON current) with respect to a forward saturation voltage (an ON voltage) is shown.

As shown in FIG. 5, temperature dependency of the forward saturation voltage in the SiC diode has a characteristic that the forward saturation voltage is larger as the junction temperature is higher if a forward current value is the same. The characteristic is opposite to the characteristic of the Si diode. In other words, the SiC diode is an element, a voltage drop characteristic of which during conduction has a positive temperature coefficient.

Therefore, by connecting the Si-FWD and the SiC-FWD in series as shown in FIG. 2, a forward saturation voltage characteristic of the FWD group connected in series is a characteristic obtained by adding the forward saturation voltage characteristic of the SiC diode to the forward saturation voltage characteristic of the Si diode. At this point, because the temperature characteristic of the SiC diode acts to cancel the temperature characteristic of the Si diode, temperature dependency of the forward saturation voltages in the FWD group is extremely small compared with temperature dependency in the Si-FWD alone. Therefore, thermal runaway does not occur unless an extreme difference occurs between the forward voltage characteristics of the Si-FWDs connected in parallel to each other because of fluctuation in manufacturing. Consequently, it is possible to reduce time and labor for the element selection and eliminate the difficulty in the element selection.

As the FWDs (the Si-FWD and the SiC-FWD) included in the FWD group, FWDs having a withstand voltage smaller than a withstand voltage of the switching element connected in anti-parallel to the FWDs (a withstand voltage between the collector and the emitter of the Si-IGBT) can be used. Therefore, it is possible to obtain a low-price power module and contribute to a reduction in costs of the apparatus.

An effect achieved by the series connection of the Si-FWD and the SiC-FWD is further supplementarily explained.

First, because a manufacturing technology for the Si diode is relatively established, even if a withstand voltage is set high, the Si diode is inexpensive. On the other hand, because the SiC diode has a relative short history of manufacturing, a SiC diode having a high withstand voltage is extremely expensive. However, if the Si-FWD and the SiC-FWD are connected in series, the Si-FWD and the SiC-FWD can share (divide) a withstand voltage of the entire switching element connected in anti-parallel to the FWDs. Therefore, it is possible to set a withstand voltage of the SiC-FWD smaller than the withstand voltage of the entire switching element.

For example, when a withstand voltage of 3.3 kilovolts is requested for the switching element used in the power converting apparatus for the railway car, an equivalent withstand voltage is requested for the FWD group connected in series. In this case, if leak currents of the Si-FWD and the SiC-FWD are taken into account in design, for example, design for setting the withstand voltage of the Si-FWD to 3.0 kilovolts and setting the withstand voltage of the SiC-FWD to 0.3 kilovolt is possible.

In the case of the switching element used in the power converting apparatus for the railway car, it is no exaggeration to say that manufacturing costs for the switching element are proportional to a withstand voltage. It is possible to suppress an increase in manufacturing costs by setting the withstand voltage of the SiC-FWD connected in series low.

The withstand voltage of a diode element is generally determined according to the magnitude of a leak current. When two diode elements are connected in series, because electric currents flowing to the two diode elements are the same, an applied voltage to an element having a small leak current is larger than an applied voltage to an element having a large leak current. Therefore, a larger withstand voltage is requested for the element having the small leak current than the element having the large leak current. Therefore, in the example explained above, a leak current is larger in the SiC-FWD than in the Si-FWD.

In the above example, a sharing ratio $V_{Si}/V_{SiC}$ of a withstand voltage $V_{Si}$ of the Si-FWD and a withstand voltage $V_{SiC}$ of the SiC-FWD is $V_{Si}/V_{SiC}=10$. However, this example is not a limitation. For example, if design for setting $V_{Si}/V_{SiC}$ to $V_{Si}/V_{SiC}>1$ is performed, it is no exaggeration to say that a sufficient suppression effect can be obtained in terms of suppressing an increase in costs in using the SiC-FWD in combination with the Si-FWD.

On the other hand, contrary to the example explained above, for example, design for setting the withstand voltage of the Si-FWD to 1.5 kilovolts and setting the withstand voltage of the SiC-FWD to 1.8 kilovolts is also possible. An effect can be obtained that it is possible to reduce an ON voltage of the entire FWD group by using the SiC-FWD, having a small ON voltage compared with the Si-FWD, in combination with the Si-FWD. As explained above, when such design is performed, a leak current of an element, the withstand voltage of which is desired to be reduced, i.e., the Si-FWD only has to be set larger than a leak current of the SiC-FWD.

In view of the viewpoints explained above, it is also possible to design withstand voltage distributions to the Si-FWD and the SiC-FWD equal. In the case of this example, there is an effect that design for achieving both of an advantage in terms of manufacturing costs and an advantage of an ON voltage reduction is possible.

It is possible to arbitrarily determine at the point of manufacturing, from the viewpoints of development related to a manufacturing technology for a high-withstand voltage SiC-FWD and a cost merit, how the withstand voltage distributions for the Si-FWD and the SiC-FWD are set. In this sense, the significance of connecting the Si-FWD and the SiC-FWD in series is extremely large.

As explained above, the power semiconductor module according to this embodiment is configured by connecting, in parallel to each other, the two element pairs each formed by connecting, in anti-parallel to each other, the Si-IGBT and the FWD group in which the Si-FWD, the voltage drop characteristic of which during conduction has the negative temperature coefficient, and the SiC-FWD, the voltage drop characteristic of which during conduction has the positive temperature coefficient, are connected in series. Therefore, with the power semiconductor module according to this embodiment, it is possible to suppress the thermal runaway phenomenon due to fluctuation in manufacturing, reduce time and labor for the element selection, and realize simplification of design and manufacturing.

Further, with the power semiconductor module according to this embodiment, a tolerance of fluctuation between the forward saturation voltage of one FWD in the parallel application and the forward saturation voltage of the other FWD can be set larger than that in the past. Therefore, it is possible to improve the yield of the power semiconductor module in the parallel application and suppress an increase in manufacturing costs.

Further, with the power semiconductor module according to this embodiment, the Si-FWD and the SiC-FWD can share the withstand voltage of the entire switching element connected anti-parallel to the FWDs. Therefore, low-withstand voltage products can be used for both of the Si-FWD and the SiC-FWD and costs of the FWDs can be reduced. Consequently, it is possible to contribute to a reduction in costs of the semiconductor power module and a reduction in costs of the power converting apparatus.

In the example explained in this embodiment, one element of the SiC-FWD and one element of the Si-FWD are used as the two semiconductor elements connected in series. However, each of the SiC-FWD and the Si-FWD does not need to be one element. For example, a plurality of elements of the SiC-FWD and one element of the Si-FWD can be connected in series or one element of the SiC-FWD and a plurality of elements of the Si-FWD can be connected in series.

In the example explained in this embodiment, the SiC-FWD is used as one of the semiconductor elements included in the FWD group in the power semiconductor module. However, the present invention is not limited to the SiC-FWD. SiC is an example of a semiconductor called wideband gap semiconductor. Besides SiC, for example, a semiconductor formed using a gallium nitride material or diamond belongs to the wideband gap semiconductor and has many characteristics similar to SiC. Therefore, a configuration in which a wideband gap semiconductor other than SiC is used constitutes the gist of the present invention.

In the example explained in this embodiment, the Si-FWD is used as the other of the semiconductor elements included in the FWD group in the power semiconductor module. However, the present invention is not limited to the Si-FWD. Si is an example of a semiconductor called narrowband gap semiconductor. Another semiconductor can be used as long as the semiconductor is a narrowband gap semiconductor, a voltage drop characteristic of which during conduction has a negative temperature coefficient as shown in FIG. 3.

In this embodiment, the configuration in which the diodes having unidirectional conductivity are used as both the semiconductor elements included in the FWD group in the power semiconductor module. However, one of the semiconductor elements only has to be an element having unidirectional conductivity. The other does not have to be an element having unidirectional conductivity. In other words, when one element included in the FWD group is the unidirectional conductive element, the other can be a conductive element not having unidirectionality. However, between the unidirectional conductive element and the conductive element, voltage drop characteristics during conduction need to have opposite characteristics each other.

Second Embodiment

In the example explained in the first embodiment, the SiC-FWD is used as one of the semiconductor elements included in the FWD group in the power semiconductor module and the Si-FWD is used as the other. In an example explained in a second embodiment, a SiC Schottky barrier diode (SiC-SBD) is used as the SiC-FWD.

The SiC-SBD has a characteristic that a voltage drop characteristic during current conduction always has a positive temperature coefficient because of a structural characteristic of the SiC-SBD. Therefore, by connecting in series the SiC-SBD having the positive temperature coefficient and a Si-FWD having a negative temperature coefficient, it is possible to suppress thermal runaway due to fluctuation in manufacturing or the like and it is possible to reduce time and labor for element selection and realize simplification of design and manufacturing.

When the SiC-SBD is used as the SiC-FWD, for example, in the inverter 16 shown in FIG. 1, it is possible to reduce an on-switching loss during operation. Therefore, if the SiC-SBD is used, it is possible to reduce the size of a cooler of a power converting apparatus and improve energy saving effect. The on-switching loss is, for example, in the inverter 16 shown in FIG. 1, a sum of a transitional loss (a turn-on loss) that occurs in the transistor element of the switching element UNI, for example, during turn-on when the switching element UNI shifts from an OFF state to an ON state and a transitional loss (a recovery loss) that occurs in the FWD group connected in anti-parallel to the transistor element in the switching element UPI. In other words, the on-switching loss is a sum of a turn-on loss that occurs on the transistor element side when one arm element included in one leg shifts from the OFF state to the ON state and a turn-off loss that occurs on the FWD side (the FWD group) when the other arm element shifts from the ON state to the OFF state.

Figure 6:
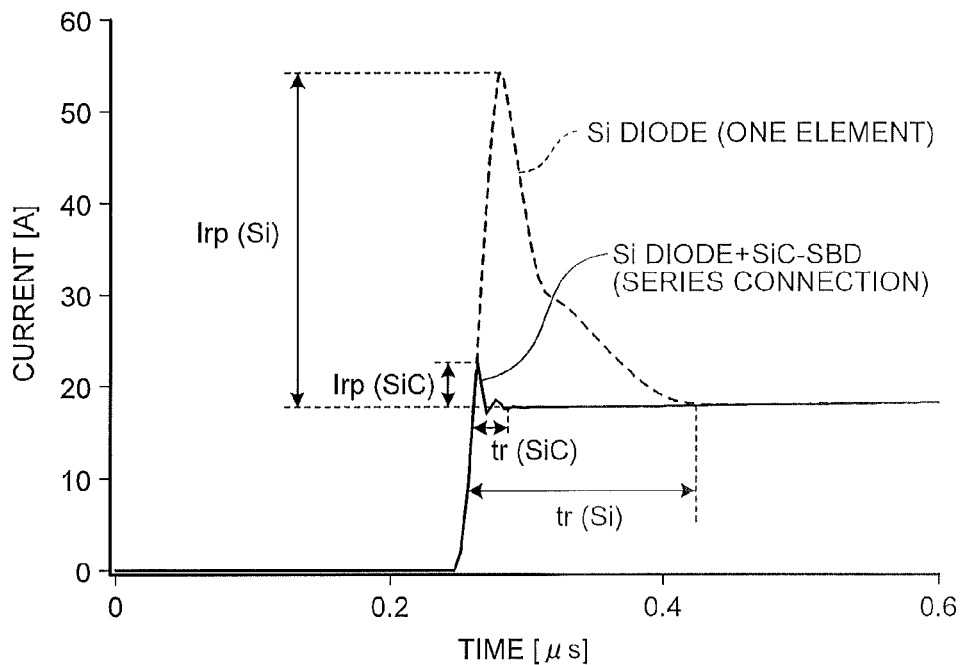
FIG. 6 is a comparative diagram of a current simulation waveform during turn-on of an IGBT in a switching element.

FIG. 6 is a comparative diagram of a current simulation waveform during turn-on of an IGBT in a switching element. In FIG. 6, switching waveforms obtained when one element of a Si diode is used as an FWD and when one element of a Si diode and one element of a SiC-SBD are connected in series are shown. Main parameters used in calculation are as described below.

Figure 7:
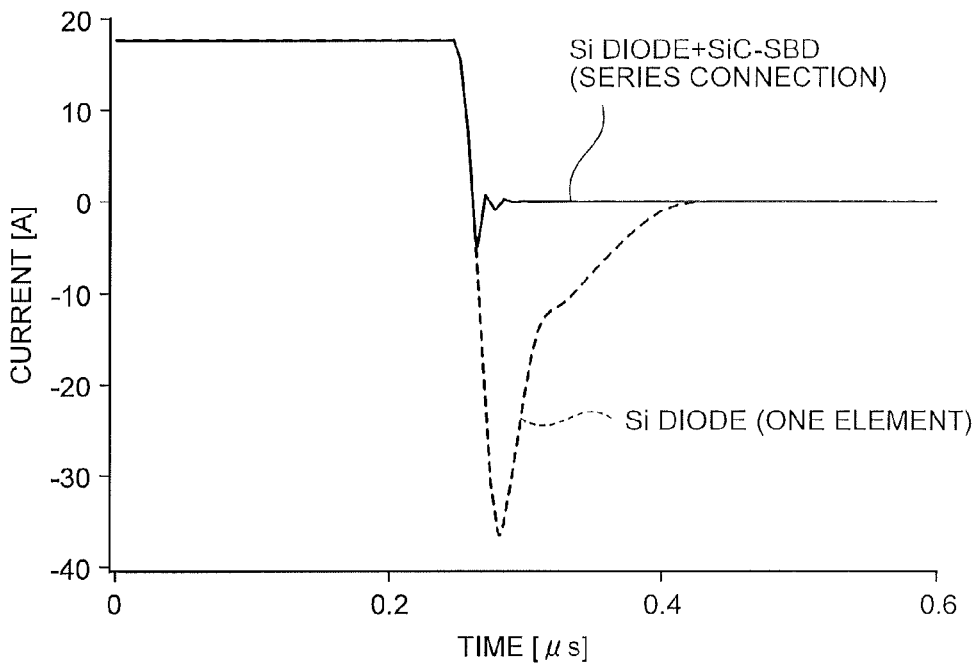
FIG. 7 is a comparative diagram of a simulation waveform of an FWD recovery current corresponding to FIG. 6.

(1) Rating of element models of the Si-FWD and the SiC-SBD
   (a) Rated voltage: about 600 V
   (b) Rated current: about 20 A
(2) Calculation conditions for a switching waveform
   (a) Load current: 18 A
   (b) Voltage: 350 V FIG. 7 is a comparative diagram of a simulation waveform of an FWD recovery current corresponding to FIG. 6. In general, a turn-on loss and a recovery loss are larger as a peak value of the recovery current and the duration of the recovery current are larger. On the other hand, as in this embodiment, a configuration in which only the one element of the Si diode is used as the FWD is changed to a series connection configuration of the one element of the Si diode and the one element of the SiC-SBD, it is possible to substantially reduce both of the peak value of the recovery current and the duration of the recovery current. In other words, with the configuration according to this embodiment, it is possible to reduce both the turn-on loss and the recovery loss to be extremely small.

Only a result is explained below. According to this simulation, the turn-on loss decreases from 0.34 mJ/pulse to 0.11 mJ/pulse and the recovery loss decreases from 0.45 mJ/pulse to 1 μj/pulse. Therefore, the on-switching loss, which is the sum of the turn-on loss and the recovery loss, decreases from 0.79 mJ to 0.111 mJ. A reduction ratio is about 86%.

The above example is a calculation example in which an element having a rated voltage of about 600 volts and a rated current of about 20 amperes. However, if the rated voltage and the rated current are larger, a further reduction in the on-switching loss can be expected. When the rated voltage and the rated current are set larger, chip thickness (substrate thickness) of the Si diode inevitably increases. Therefore, the volume of a withstand voltage layer in the Si diode increases. If the volume of the withstand voltage layer in the Si diode increases, charges accumulated in the withstand voltage layer increase. Therefore, only in the Si diode, the recovery current including an electric current in sweeping out the accumulated charges increases to be extremely large according to the rated voltage and the rated current. On the other hand, the recovery current of the SiC-SBD is substantially fixed irrespective of the rated voltage and the rated current. Therefore, if the rated voltage and the rated current are larger, a reduction effect of the on-switching loss inevitably increases.

In the example explained in this embodiment, the SiC-SBD is used as one of the semiconductor elements included in the FWD group in the power semiconductor module. However, the present invention is not limited to the SiC-SBD. SiC is an example of a semiconductor called wideband gap semiconductor. Besides SiC, for example, a semiconductor formed using a gallium nitride material or diamond belongs to the wideband gap semiconductor and has many characteristics similar to SiC. Therefore, a configuration in which a wideband gap semiconductor other than SiC is used constitutes the gist of the present invention.

In the example explained in this embodiment, one element of the SiC-SBD and one element of the Si-FWD are used as the two semiconductor elements connected in series. However, each of the SiC-SBD and the SiC-FWD does not need to be one element. For example, a plurality of elements of the SiC-SBD and one element of the Si-FWD can be connected in series or one element of the SiC-SBD and a plurality of elements of the Si-FWD can be connected in series.

In this embodiment, the Si-FWD is used as the other of the semiconductor elements included in the FWD group in the power semiconductor module. However, the present invention is not limited to the Si-FWD. Si is an example of a semiconductor called narrowband gap semiconductor. A configuration in which a narrowband gap semiconductor, a voltage drop characteristic of which during conduction has a negative temperature coefficient as shown in FIG. 3, is used is also included in the gist of the present invention.

In this embodiment, the configuration is disclosed in which the diodes (the SiC-SBD and the Si-FWD) having unidirectional conductivity are used as both the semiconductor elements included in the FWD group in the power semiconductor module. However, an element connected in series to the SiC-SBD does not have to be an element having unidirectional conductivity and can be a simple conductive element.

If an element is an element, a voltage drop characteristic of which during conduction has a positive temperature coefficient, operation is stable only with the element and the thermal runaway state is not shown. Therefore, a voltage drop characteristic during conduction related to the diode element connected in series to the SiC-SBD can be either a positive or negative voltage drop characteristic.

Third Embodiment

In the first and second embodiments, the Si-IGBT is used as the transistor element in the switching element (see FIG. 2). However, in a third embodiment, a configuration is explained in which two Si-IGBTs in the parallel application are respectively SiC-MOSFETs (Metal Oxide Semiconductor Field Effect Transistors). In the first and second embodiments, attention is paid to fluctuation in a forward saturation voltage of one FWD and a forward saturation voltage of the other FWD in the parallel application. However, such fluctuation between the elements is calculated concerning the transistor element depending on a form of use, although not so much as for an FWD.

Figure 8:
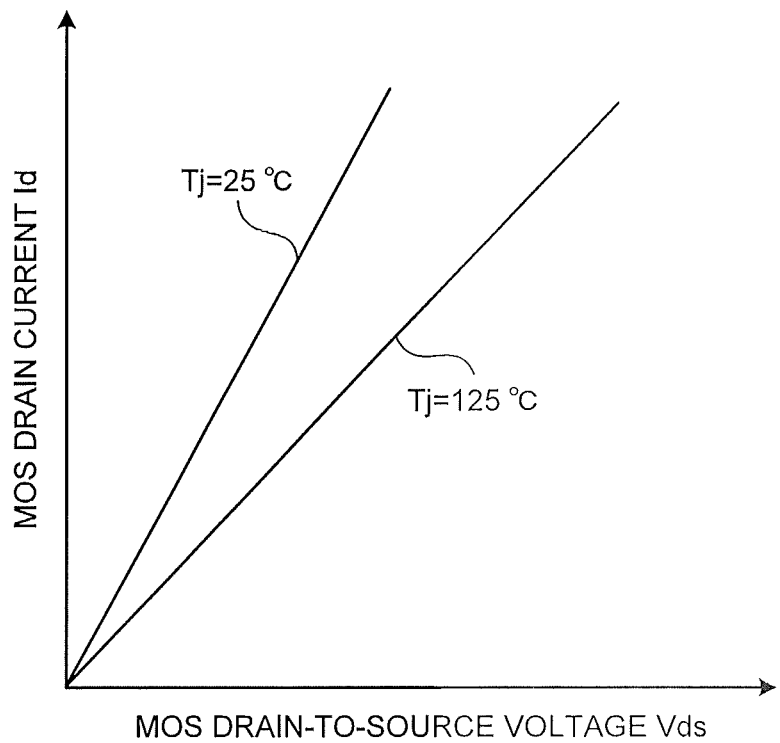
FIG. 8 is a graph for explaining temperature dependency of current-voltage characteristics in linear regions of SiC-MOSFETs.

FIG. 8 is a graph for explaining temperature dependency of current-voltage characteristics in linear regions of the SiC-MOSFETs. As shown in FIG. 8, because a voltage drop characteristic during current conduction has a positive temperature coefficient, the SiC-MOSFETs operate to balance each other when connected in parallel. Further, when the SiC-MOSFET is, for example, N-channel MOSFETs, because the SiC-MOSFETs are unipolar devices in which charges carrying an electric current are only electrons, the SiC-MOSFETs hardly have residual charges on the inside thereof during turn-off when the SiC-MOSFETs shift from the ON state to the OFF state. Therefore, as the transistor elements in the switching element, the SiC-MOSFETs are used instead of the Si-IGBTs. Consequently, it is possible to improve parallel balance of the transistor elements in the parallel application, improve the yield of the entire semiconductor module, and suppress an increase in manufacturing costs.

Figure 9:
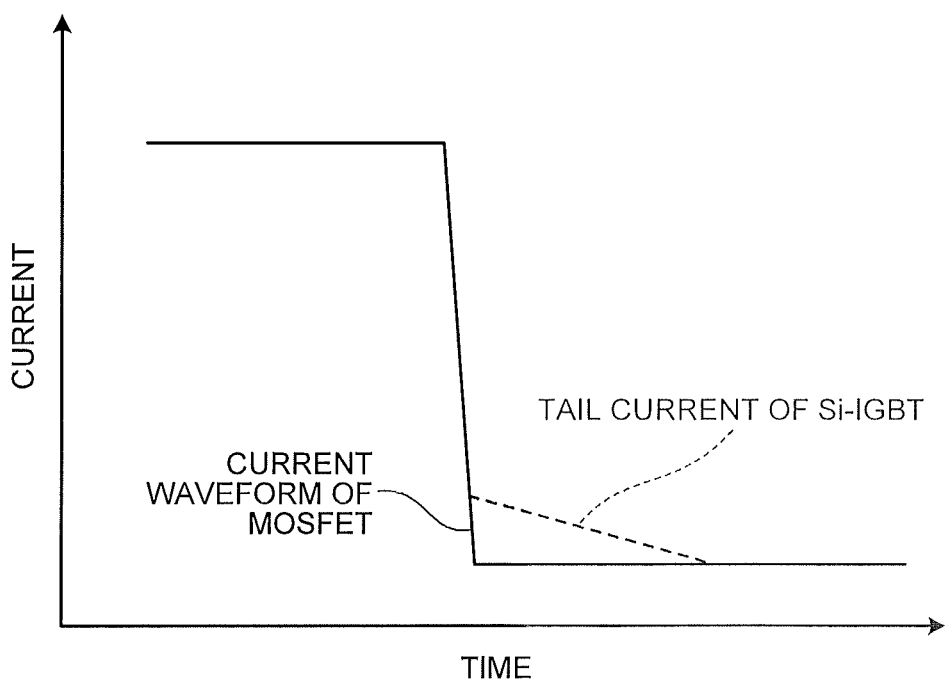
FIG. 9 is a schematic diagram concerning turn-off current waveforms of a Si-IGBT and the SiC-MOSFET.

FIG. 9 is a schematic diagram concerning turn-off current waveforms of the Si-IGBT and the SiC-MOSFET. In the Si-IGBT, because there is a tail current shown in the figure, a turn-off loss due to the tail current is present. On the other hand, because the SiC-MOSFET has structure hardly having residual charges, there is hardly a tail current during turn-off. Therefore, as the transistor element in the switching element, the SiC-MOSFET is used instead of the Si-IGBT. Consequently, it is possible to reduce a turn-off loss, reduce the size of a cooler of a power converting apparatus, and improve a power saving effect.

Temperature characteristics of the Si-IGBT are not specifically explained above. However, both of the Si-IGBT having a positive temperature characteristic and the Si-IGBT having a negative temperature characteristic can be manufactured according to design. On the other hand, a unipolar device (a switching element of a unipolar type) such as a MOSFET inevitably has a positive temperature characteristic without being limited to SiC. Therefore, design in configuring the power semiconductor module according to this embodiment is easy. The unipolar device is an extremely useful device in the power semiconductor module according to this embodiment.

In the example explained in this embodiment, the SiC-MOSFET is used as the transistor element in the switching element. However, the present invention is not limited to the SiC-MOSFET. SiC is an example of a semiconductor called wideband gap semiconductor. Besides SiC, for example, a semiconductor formed using a gallium nitride material or diamond belongs to the wideband gap semiconductor and has many characteristics similar to SiC. Therefore, a configuration in which a wideband gap semiconductor other than SiC is used constitutes the gist of the present invention.

The configuration examples of the power semiconductor modules according to the first to third embodiments are explained above. However, the power semiconductor modules according to the first to third embodiments are suitably used in power converting apparatuses mounted a railway car and an automobile. When the power semiconductor module is used as a power semiconductor module mounted on a car, during braking or during regenerative driving, a current amount fed to the FWD side is extremely large. Therefore, as indicated by the above simulation result, the reduction effect of the on-switching loss increases. This is effective for improvement of the efficiency of the power converting apparatuses and a reduction in costs.

INDUSTRIAL APPLICABILITY

As explained above, the present invention is useful as a power semiconductor module that can improve the yield of the power semiconductor module in the parallel application and suppress an increase in manufacturing costs.

REFERENCE SIGNS LIST

1 RAILWAY CAR
2 OVERHEAD LINE
3 CURRENT COLLECTOR
4 WHEEL
5 RAIL
6 TRANSFORMER
10 POWER CONVERTING APPARATUS
12 CONVERTER
14 CAPACITOR
16 INVERTER
18 MOTOR
20 POWER SEMICONDUCTOR MODULE
22 FIRST POWER MODULE
24, 34 FWD GROUPS
24a, 34a FWDs (Si-FWDs)
24b, 34b FWDs (SiC-FWDs)
25, 35 IGBTs (Si-IGBTs)
26 ELEMENT PAIR (FIRST ELEMENT PAIR)
32 SECOND POWER MODULE
36 ELEMENT PAIR (SECOND ELEMENT PAIR)
C COLLECTOR ELECTRODE
E EMITTER ELECTRODE
UNC, VNC, UNI, VNI, WNI, UPC, VPC, UPI, VPI, WPI SWITCHING ELEMENTS

The invention claimed is:

1. A power semiconductor module comprising:
a first element pair formed by connecting, in anti-parallel to each other, a first switching element and a first element group in which a first unidirectional conductive element formed of a narrowband gap semiconductor, a voltage drop characteristic of which during conduction has a negative temperature coefficient, and a first conductive element formed of a wideband gap semiconductor, a voltage drop characteristic of which during conduction has a positive temperature coefficient, are connected in series; and
a second element pair formed by connecting, in anti-parallel to each other, a second switching element and a second element group in which a second unidirectional conductive element formed of the narrowband gap semiconductor, a voltage drop characteristic of which during conduction has a negative temperature coefficient, and a second conductive element formed of the wideband gap semiconductor, a voltage drop characteristic of which during conduction has a positive temperature coefficient, are connected in series, wherein
the first and second element pairs are connected in parallel,
a withstand voltage of the first conductive element is larger than a withstand voltage of the first unidirectional conductive element,
a withstand voltage of the second conductive element is larger than a withstand voltage of the second unidirectional conductive element, and
the first and second conductive elements are fly wheel diodes, and the first and second unidirectional conductive elements are SiC Schottky barrier diodes.

2. The power semiconductor module according to claim 1, wherein the first and second conductive elements are unidirectional conductive elements.

3. The power semiconductor module according to claim 1, wherein the wideband gap semiconductor is formed of a semiconductor formed using silicon carbide, a gallium nitride material, or diamond.

4. A power converting apparatus comprising plural sets of legs, each leg being formed by connecting, in series, a pair of power semiconductor modules according to claim 1, wherein one power semiconductor module of the pair forms a positive side arm and the other power semiconductor module of the pair forms a negative side arm, the power converting apparatus converting a direct-current voltage or an alternating-current voltage applied to the sets of legs connected in parallel into a desired alternating-current voltage and outputting the alternating-current voltage.

5. A railway car comprising:
the power converting apparatus according to claim 4; and
a motor configured to receive power supply from the power converting apparatus and drive the car.

* * * * *